United States Patent
Park

(10) Patent No.: US 9,431,332 B2
(45) Date of Patent: Aug. 30, 2016

(54) SEMICONDUCTOR PACKAGE

(71) Applicant: Samsung Electronics Co., Ltd., Suwon-si, Gyeonggi-do (KR)

(72) Inventor: Jin-woo Park, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/727,785

(22) Filed: Jun. 1, 2015

(65) Prior Publication Data

US 2016/0079163 A1 Mar. 17, 2016

(30) Foreign Application Priority Data

Sep. 11, 2014 (KR) ........................ 10-2014-0120211

(51) Int. Cl.
| | | |
|---|---|---|
| *H01L 23/498* | (2006.01) | |
| *H01L 23/522* | (2006.01) | |
| *H01L 25/065* | (2006.01) | |
| *H01L 23/48* | (2006.01) | |
| *H01L 23/31* | (2006.01) | |

(52) U.S. Cl.
CPC ..... *H01L 23/49811* (2013.01); *H01L 23/3192* (2013.01); *H01L 23/481* (2013.01); *H01L 23/3128* (2013.01); *H01L 2224/16145* (2013.01); *H01L 2224/16225* (2013.01); *H01L 2924/15174* (2013.01); *H01L 2924/15311* (2013.01); *H01L 2924/181* (2013.01)

(58) Field of Classification Search
CPC ................. H01L 2225/06541; H01L 23/481; H01L 23/49811; H01L 23/3128; H01L 25/0657; H01L 23/49827; H01L 2224/0557; H01L 2224/13025; H01L 2924/15311
See application file for complete search history.

(56) References Cited

U.S. PATENT DOCUMENTS

| | | | |
|---|---|---|---|
| 7,208,838 B2 | 4/2007 | Masuda | |
| 7,777,345 B2 | 8/2010 | Lee et al. | |
| 7,969,013 B2 | 6/2011 | Chen et al. | |
| 8,299,612 B2 | 10/2012 | West et al. | |
| 8,399,987 B2 | 3/2013 | Kwon et al. | |
| 8,551,882 B2 | 10/2013 | Schmitt et al. | |
| 2011/0298097 A1 | 12/2011 | Sueyoshi et al. | |
| 2012/0199981 A1* | 8/2012 | Jeong ................. | H01L 23/481 257/774 |
| 2012/0248579 A1* | 10/2012 | Endo ................. | H01L 21/76898 257/621 |
| 2013/0037939 A1 | 2/2013 | Lee et al. | |
| 2013/0093098 A1 | 4/2013 | Yang et al. | |
| 2013/0140690 A1 | 6/2013 | Lin et al. | |
| 2013/0313722 A1 | 11/2013 | Hwang et al. | |
| 2013/0320506 A1 | 12/2013 | Schmitt et al. | |

(Continued)

*Primary Examiner* — Jasmine Clark
(74) *Attorney, Agent, or Firm* — Renaissance IP Law Group LLP

(57) ABSTRACT

A semiconductor package comprising: a semiconductor chip comprising a first surface on a first side of the semiconductor chip and a second surface on a second side of the semiconductor chip, wherein the first side and the second side are opposite sides of the semiconductor chip; a through-electrode penetrating the semiconductor chip between the first surface and the second surface; a passivation layer formed on the second surface of the semiconductor chip; and an electrode pad formed on an upper surface of the passivation layer and electrically connected to the through-electrode, wherein the passivation layer comprises a first passivation layer formed on the second surface of the semiconductor chip and a second passivation layer formed on an upper surface of the first passivation layer, and the electrode pad penetrates the second passivation layer to contact the upper surface of the first passivation layer.

20 Claims, 17 Drawing Sheets

(56) References Cited

U.S. PATENT DOCUMENTS

| | | |
|---|---|---|
| 2014/0008810 A1 | 1/2014 | Leong et al. |
| 2014/0008815 A1 | 1/2014 | Park et al. |
| 2014/0027920 A1 | 1/2014 | Kodama |
| 2014/0084375 A1 | 3/2014 | Lee et al. |
| 2014/0084473 A1 | 3/2014 | Moon et al. |
| 2014/0127904 A1 | 5/2014 | Farooq et al. |

\* cited by examiner

SEMICONDUCTOR PACKAGE

CROSS-REFERENCE TO RELATED APPLICATION

This application claims the benefit of Korean Patent Application No. 10-2014-0120211, filed on Sep. 11, 2014, in the Korean Intellectual Property Office, the disclosure of which is incorporated herein in its entirety by reference.

BACKGROUND

Embodiments relate to semiconductor packages, and more particularly, to semiconductor packages including a semiconductor chip having a through-electrode.

As miniaturization and high capacity data processing are useful for semiconductor products, semiconductor chips which are used in the semiconductor products have been made to have a single package and a high degree of integration. The request for miniaturization has accelerated the development of a packaging technology to a level close to a chip size, and has increased the importance of a packaging technology which may improve mechanical and electrical reliability in mounting semiconductor chips. Recently, a semiconductor package structure which includes a semiconductor chip having a through-electrode, such as a through-silicon via (TSV), has been developed. In the semiconductor package including the semiconductor chip, defects may occur in elements such as the semiconductor chip, a semiconductor chip connection member, and a molding member.

SUMMARY

An embodiment includes a semiconductor package comprising: a semiconductor chip comprising a first surface on a first side of the semiconductor chip and a second surface on a second side of the semiconductor chip, wherein the first side and the second side are opposite sides of the semiconductor chip; a through-electrode penetrating the semiconductor chip between the first surface and the second surface; a passivation layer formed on the second surface of the semiconductor chip; and an electrode pad formed on an upper surface of the passivation layer and electrically connected to the through-electrode, wherein the passivation layer comprises a first passivation layer formed on the second surface of the semiconductor chip and a second passivation layer formed on an upper surface of the first passivation layer, and the electrode pad penetrates the second passivation layer to contact the upper surface of the first passivation layer.

An embodiment includes a semiconductor package comprising: a plurality of semiconductor chips stacked on a substrate, including a first semiconductor chip comprising: a through-electrode penetrating the first semiconductor chip; a first passivation layer formed on an upper surface of the first semiconductor chip; a second passivation layer formed on an upper surface of the first passivation layer; and a first electrode pad contacting an upper surface of the second passivation layer, extending in parallel with the upper surface of the second passivation layer, and including a portion penetrating the second passivation layer to contact the upper surface of the first passivation layer; and a second semiconductor chip of the plurality of the semiconductor chips electrically coupled to the first electrode pad of the first semiconductor chip.

An embodiment includes a semiconductor package, comprising: a semiconductor chip; a through-electrode penetrating the semiconductor chip; a first passivation layer formed on an upper surface of the semiconductor chip; a second passivation layer formed on an upper surface of the first passivation layer; and an electrode pad electrically connected to the through-electrode, penetrating the second passivation layer, and contacting the first passivation layer.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
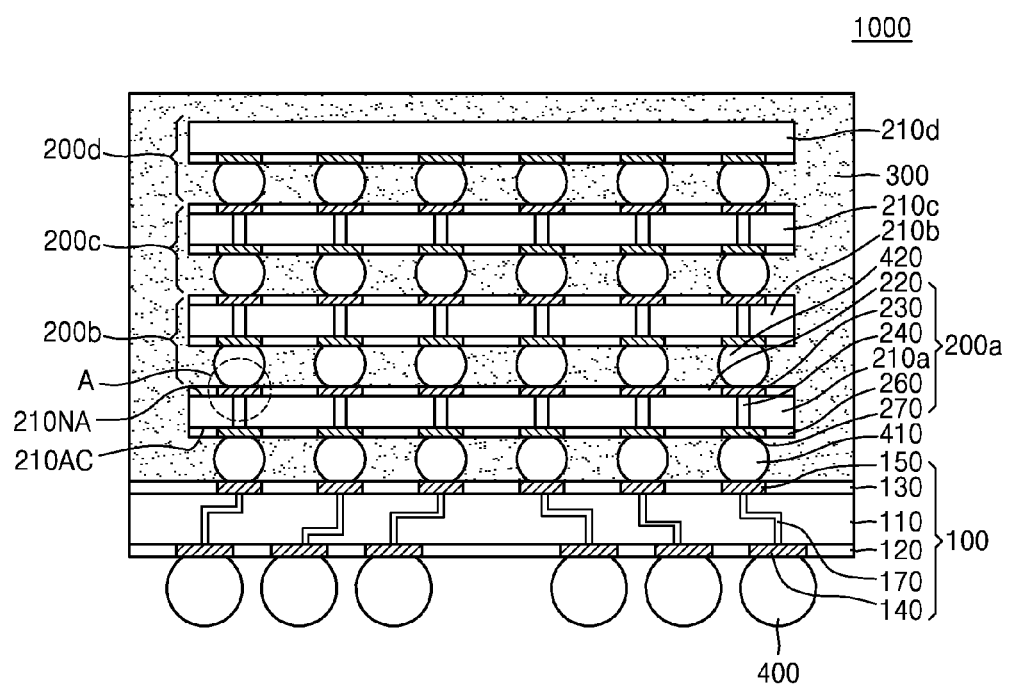
FIG. 1 is a cross-sectional view of a semiconductor package according to an embodiment.

Embodiments now will be described more fully hereinafter with reference to the accompanying drawings. Embodiments may, however, take many different forms and should not be construed as limited to the particular embodiments set forth herein. Rather, these embodiments are provided so that this disclosure will be thorough and complete, and will fully convey the scope to one of ordinary skill in the art. In the drawings, the thicknesses of layers and regions and the sizes of components may be exaggerated for clarity. Like reference numerals refer to like elements throughout.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between," versus "directly between," "adjacent," versus "directly adjacent," etc.) When an element, such as a layer, a region, or a substrate, is referred to as being formed "on an upper surface" or "on a lower surface," it may be formed "above" or "below," respectively, as illustrated in the figures.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments.

As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which exemplary embodiments belong.

Hereinafter, embodiments will be described in detail.

FIG. 1 is a cross-sectional view of a semiconductor package 1000 according to embodiments. Referring to FIG. 1, the semiconductor package 1000 may include a substrate 100, first through fourth semiconductor chip structures 200*a* through 200*d*, a molding member 300, an external connection member 400, a chip mounting member 410, and a chip connection member 420. The first semiconductor chip structure 200*a* may include a first semiconductor chip 210*a*, a passivation layer 220, an electrode pad 230, a through-electrode 240, a lower protection layer 260, and a lower electrode 270. The second semiconductor chip structure 200*b* and the third semiconductor chip structure 200*c* may be formed as the same shape as that of the first semiconductor chip structure 200*a* and may include similar elements as those of the first semiconductor chip structure 200*a*. The fourth semiconductor chip 200*d* may have similar elements; however, as illustrated, the fourth semiconductor chip 200*d* may, but need not have all of the similar elements. In FIG. 1, it is illustrated and described that the semiconductor package 1000 has four semiconductor chip structures, that is, the first through fourth semiconductor chip structures 200*a* through 200*d*. However, it is only for convenience of explanation, and embodiments are not limited thereto. Other embodiments may include other numbers of semiconductor chips.

The substrate 100 may be a supporting substrate on which the first through fourth semiconductor chip structures 200*a* through 200*d* are mounted. The substrate 100 may include a body layer 110, a lower protection layer 120, an upper protection layer 130, a lower pad 140, an upper pad 150, and a substrate wiring pattern 170. The substrate 100 may be formed based on at least one selected from a ceramic substrate, a printed circuit board (PCB), a glass substrate, and an interposer substrate. In an embodiment, the substrate 100 may be formed of an active wafer.

The substrate wiring pattern 170 in a single layer or multilayer may be formed in the body layer 110, and the lower pad 140 and the upper pad 150 may be electrically and/or physically connected to each other through the substrate wiring pattern 170. The lower protection layer 120 and the upper protection layer 130 protect the substrate 100 and may be formed of, for example, solder resist.

The lower pad 140 may be formed on a lower surface of the body layer 110, exposed by the lower protection layer 120, and electrically and/or physically connected to the substrate wiring pattern 170 in the body layer 110. The lower pad 140 may be formed on the lower surface of the body layer 110 by using a conductive material. In an embodiment, an under bump metal (UBM) may be formed on the lower pad 140. The lower pad 140 may be formed of aluminum (Al) or copper (Cu) by a pulse plating method or a direct circuit (DC) plating method. However, materials of the lower pad 140 and methods of forming the lower pad 140 are not limited thereto.

The upper pad 150 may be formed on an upper surface of the body layer 110, exposed by the upper protection layer 130, and electrically and/or physically connected to the substrate wiring pattern 170 in the body layer 110. Materials of the upper pad 150 and methods of forming the upper pad 150 may be the same as the materials of the lower pad 140 and the methods of forming the lower pad 140.

The chip mounting member 410 may be electrically and/or physically connected to the through-electrode 240 through the lower electrode 270 of the first semiconductor chip structure 200*a*, and thus, the first semiconductor chip structure 200*a* and the substrate 100 may be electrically and/or physically connected to each other. Multiple chip mounting members 410 may be coupled between corresponding lower electrodes 270 and upper pads 150. Although FIG. 1 illustrates six chip mounting members 410, any number may be present. The chip mounting member 410 may have, for example, a sphere shape, and the sphere shape may be deformed to have slightly flat upper and lower surfaces which are bonded to other elements. In an embodiment, the chip mounting member 410 may be formed as a solder ball.

The substrate wiring pattern 170 may be formed to penetrate through the body layer 110 between the upper surface and the lower surface thereof. The substrate wiring pattern 170 may be formed of a conductive material. The substrate wiring pattern 170 may electrically connect the lower pad 140 and the upper pad 150.

The external connection member 400 may be formed on a lower surface of the lower pad 140 and may allow the semiconductor package 1000 to bemounted on an external system substrate, a main board, or the like. The external connection member 400 may be formed of a conductive material, for example, Cu, Al, Ag, Sn, Au, solder, or a combination thereof. However, materials forming the external connection member 400 are not limited thereto. The external connection member 400 may be formed in a multi-layer or a single layer structure.

The first semiconductor chip structure 200*a* may include the first semiconductor chip 210*a*, the passivation layer 220, the electrode pad 230, the through-electrode 240, the lower protection layer 260, and the lower electrode 270. The second and third semiconductor chip structures 200b and 200c may also include the above-described elements of the first semiconductor chip structure 200a. The second through fourth semiconductor chip structures 200b through 200d may be formed of similar materials by using similar manufacturing methods as the first semiconductor chip structure 200a. Thus, hereinafter, descriptions will be made by focusing on the first semiconductor chip structure 200a, and repeated descriptions with respect to the second through fourth semiconductor chip structures 200b through 200d will be omitted.

The first semiconductor chip structure 200a may be formed based on an active wafer, an interposer substrate, or other substrate. Here, the active wafer refers to a wafer, such as a silicon wafer, on which a semiconductor chip may be formed. The first semiconductor chip 210a may include a group IV material wafer, such as a silicon wafer, a groups III-V compound wafer, or a wafer formed of other materials. Also, the first semiconductor chip 210a may be formed of a single crystal wafer, such as a silicon single crystal wafer, in terms of a manufacturing method thereof. However, the first semiconductor chip 210a is not limited to a single crystal wafer, and may be formed of various wafers, such as an epitaxial wafer, a polished wafer, an annealed wafer, and a silicon-on-insulator wafer. The epitaxial wafer refers to a wafer in which a crystal material is grown on a single crystal silicon substrate. The first semiconductor chip 210a may include an active surface 210AC and a non-active surface 210NA on an opposite side of the first semiconductor chip 210a from the active surface 210AC.

In an embodiment, the first through fourth semiconductor chips 210a through 210d respectively included in the first through fourth semiconductor chip structures 200a through 200d may each include a memory semiconductor device. The first through fourth semiconductor chips 210a through 210d may include at least one selected from, for example, DRAM, SRAM, flash memory, EEPROM, PRAM, MRAM, and RRAM. Although it is illustrated in FIG. 1 that the first through fourth semiconductor chips 210a through 210d have all the same size, other embodiments are not limited thereto. In some embodiments, the first semiconductor chip 210a may include a logic semiconductor chip. For example, the first semiconductor chip 210a may be a microprocessor, a central processing unit (CPU), a controller, an application specific integrated circuit (ASIC), similar devices, combinations of such devices, or the like.

The first semiconductor chip 210a may include the through-electrode 240 penetrating between the non-active surface 210NA and the active surface 210AC. In some embodiments, the through-electrode 240 may be a through silicon via (TSV). An uppermost surface level of the through-electrode 240 may be the same as an uppermost surface level of the first semiconductor chip 210a. The through-electrode 240 will be described in detail later with reference to FIG. 2A.

The first semiconductor chip 210a of the first semiconductor chip structure 200a may be electrically and/or physically connected to the second semiconductor chip 210b of the second semiconductor chip structure 200b stacked on an upper surface of the first semiconductor chip structure 200a, through the through-electrode 240. In detail, the through-electrode 240 may be electrically and/or physically connected with the electrode pad 230, and the electrode pad 230 may be electrically and/or physically connected with the second semiconductor chip 210b formed above the first semiconductor chip 210a, through the chip connection member 420. The through-electrode 240 may be connected with the lower electrode 270, and the lower electrode 270 may be connected to the chip mounting member 410 so that the first semiconductor chip 210a may be electrically and/or physically connected with the substrate 100.

The passivation layer 220 is formed on the non-active surface 210NA of the first semiconductor chip 210a and protects the first semiconductor chip 210a from the outside. The passivation layer 220 may be formed of an oxide layer or a nitride layer, or a double layer including an oxide layer and a nitride layer. The passivation layer 220 will be described in detail later with reference to FIG. 2A.

The electrode pad 230 may be formed of a conductive material on the non-active surface 210NA of the first semiconductor chip 210a and may be electrically and/or physically connected with the through-electrode 240 by penetrating a portion of the passivation layer 220. Shapes of, materials of, and methods of forming of the electrode pad 230 will be described in detail later with reference to FIGS. 2A and 2B.

The lower protection layer 260 may be formed on the active surface 210AC of the first semiconductor chip 210a. The lower protection layer 260 may be formed of an oxide layer or a nitride layer, or a double layer including an oxide layer and a nitride layer.

The lower electrode 270 may be formed on the active surface 210AC of the first semiconductor chip 210a and may be directly connected with a lower surface of the through-electrode 240. The lower electrode 270 may be electrically and/or physically connected with the chip mounting member 410. The lower electrode 270 may include at least one metal material selected from Al, Cu, Ni, W, Sn, Ag, and Au. An under bump metal (UBM) may be formed on the lower electrode 270.

The chip connection member 420 may be electrically and/or physically connected with the through-electrode 240 through the electrode pad 230. Multiple chip connection members 420 may be present. The chip connection member 420 may have, for example, a sphere shape, and the sphere shape may be deformed to have slightly flat upper and lower surfaces which are bonded to other elements. However, embodiments not limited thereto, and the chip connection member 420 may have other shapes than the sphere shape described above. The chip connection member 420 may be formed of a conductive material, such as Cu, Al, Ag, Tin, Au, or solder. However, materials of the chip connection member 420 are not limited thereto. The chip connection member 420 may be formed as a multi-layer or a single layer structure. For example, when formed as a multi-layer structure, the chip connection member 420 may include a copper pillar and solder, and when formed as the single layer, the chip connection member 420 may be formed of Tin-Ag solder or Cu. However, the chip connection member 420 is not limited thereto and may have a flip chip connection structure, such as a grid array, such as a pin grid array, a ball grid array, or a land grid array.

The molding member 300 may be formed to encapsulate an upper surface of the substrate 100 and upper surfaces and side surfaces of the first through fourth semiconductor chip structures 200a through 200d. Accordingly, the substrate 100 and the first through fourth semiconductor chip structures 200a through 200d may be protected from the outside. The molding member 300 may encapsulate the side surface of the first semiconductor chip 210a and a portion of the upper surface of the first semiconductor chip 210a. The molding member 300 may be formed of, for example, an epoxy based material, a thermosetting material, a thermoplastic material, or a UV-processed material. The thermosetting material may include a hardening agent of a phenol type, an acid anhydride type, or an amine type, or an addition agent of an acrylic polymer. In some embodiments, the molding member 300 may be formed of an epoxy molding compound (EMC). The molding member 300 may be formed by using a molded under-fill (MUF) method. Accordingly, the molding member 300 may be formed to fill between the chip mounting member 410 and the chip connection member 420.

In some embodiments, a heat dissipation member may be formed in a portion of an upper surface of the molding member 300.

Figure 2A:
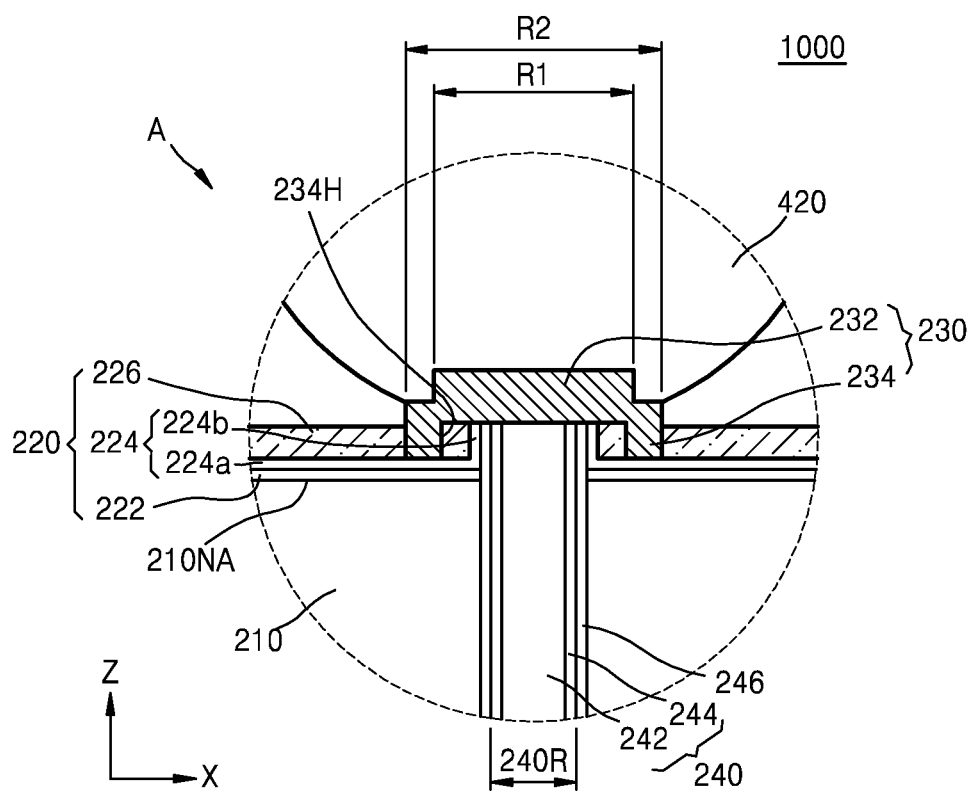
FIG. 2A is an enlarged cross-sectional view of an element of a semiconductor package according to an embodiment.

FIG. 2A is an enlarged cross-sectional view of an electrode pad bonding portion A of FIG. 1, from among elements of the semiconductor package 1000. The electrode pad bonding portion A is part of the first semiconductor chip structure 200a. However, since the second through fourth semiconductor chip structures 200b through 200d may include similar elements, descriptions below may be commonly applied to the second through fourth semiconductor chip structures 200b through 200d in addition to similar structures of the first semiconductor chip structure 200a. Hereinafter, the expressions "first" through "fourth" in the first through fourth semiconductor chip structures 200a through 200d will be omitted.

Referring to FIG. 2A, the semiconductor package 1000 may include a semiconductor chip 210, the passivation layer 220 formed on the non-active surface 210NA of the semiconductor chip 210, the electrode pad 230 formed on an upper surface of the passivation layer 220 and connected with the through-electrode 240, the through-electrode 240 penetrating the semiconductor chip 210, and the chip connection member 420.

The through-electrode 240 may be formed along a third direction (direction z) which is perpendicular to an upper surface of the semiconductor chip 210, between the upper surface and a lower surface of the semiconductor chip 210. The through-electrode 240 may include a wiring metal layer 242 and a barrier metal layer 244. A through-electrode insulating layer 246 may be formed at a side surface of the through-electrode 240. In an embodiment, the wiring metal layer 242 may be formed as a pillar shape and the barrier metal layer 244 may be formed as a pipe shape conformally surrounding a side surface of the wiring metal layer 242. The through-electrode insulating layer 246 may be formed as a pipe shape surrounding a side surface of the barrier metal layer 244. The wiring metal layer 242 may include one or more selected from Al, Au, Be, Bi, Co, Cu, Hf, In, Mn, Mo, Ni, Pb, Pd, Pt, Rh, Re, Ru, Ta, Te, Ti, W, Zn, and Zr. For example, the wiring metal layer 242 may include a stack of one or more selected from W, Al, and Cu. The barrier metal layer 244 may include a stack of one or more selected from Ti, Ta, TiN, and TaN. The through-electrode insulating layer 246 may include an insulating material, such as a silicon oxide ($SiO_x$) layer and/or a silicon nitride (SiN) layer.

The passivation layer 220 may be formed on the non-active surface 210NA of the semiconductor chip 210. The passivation layer 220 may extend along a first direction (direction x) which is in parallel with the non-active surface 210NA. The passivation layer 220 may protect the semiconductor chip 210 from external stimuli or pressures. The passivation layer 220 may be formed of an oxide layer or a nitride layer, or a double layer including an oxide layer and a nitride layer. The passivation layer 220 may include a first passivation layer 222, a second passivation layer 224, and a third passivation layer 226. For example, the first passivation layer 222 may be formed of a silicon oxide ($SiO_x$) layer, the second passivation layer 224 may be formed of a silicon nitride (SiN) layer, and the third passivation layer 226 may be formed of a silicon oxide ($SiO_x$) layer. That is, the passivation layer 220 may be formed in a $SiO_x$—SiN—$SiO_x$ (ONO) structure. Although a particular number of layers and materials of layers have been used as examples, the passivation layer 220 may include different numbers of layers and different materials.

The second passivation layer 224 may include a first region 224a extending in the first direction (direction x) which is in parallel with the non-active surface 210NA and a second region 224b contacting the side surface of the through-electrode 240 and extending in the third direction (direction z) which is perpendicular to the non-active surface 210NA.

The electrode pad 230 may be formed on the second passivation layer 224. The electrode pad 230 may be formed as a substantially cylindrical or polygonal mesa shape. The electrode pad 230 may include a body portion 232 and a penetrating portion 234.

The second region 224b of the second passivation layer 224 may be interposed between the penetrating portion 234 of the electrode pad 230 and the penetrating electrode 240. The first region 224a and the second region 224b of the second passivation layer 224 may be formed integrally. The third passivation layer 226 may be interposed between the second region 224b and the penetrating portion 234 of the electrode pad 230.

A lower surface of the body portion 232 may be directly connected to an upper surface of the through-electrode 240. The body portion 232 may be formed at an upper surface of the third passivation layer 226 along the first direction (direction x) which is in parallel with the non-active surface 210NA. A diameter R1 of an uppermost end of the body portion 232 may be smaller than a diameter R2 of a bottommost end of the body portion 232 or a largest diameter of the electrode pad 230 that is coplanar with the diameter R1. A diameter 240R of the through-electrode 240 may be smaller than the diameter R2 of the bottommost end of the body portion 232. In a particular embodiment, the diameter 240R may also be smaller than the diameter R1.

The through-portion 234 may be formed such that the through-portion 234 penetrates between the upper surface of the third passivation layer 226 and a lower surface of the third passivation layer 226 along the third direction (direction z) which is perpendicular to the non-active surface 210NA, so as to surround a side surface portion of the through-electrode 240. The through-portion 234 may protrude toward the first passivation layer 222 from the body portion 232 along the third direction (direction z). A bottommost end of the through-portion 234 may contact an upper surface of the second passivation layer 224. In terms of a manufacturing method, the through-portion 234 may be formed such that an electrode pad hole 234H is formed in the third passivation layer 226 in a filled state. An upper surface level of the body portion 232 may be higher than an upper surface level of the through-portion 234. However, in some embodiments, the upper surface of the body portion 232 may extend overlap the electrode pad hole 234H in the first direction (direction x).

The body portion 232 and the through-portion 234 may be formed integrally. However, in other embodiments, the body portion 232 and the through-portion 234 may be separate structures.

The electrode pad 230 may be formed of a conductive material. The electrode pad 230 may include Al, Cu, Ni, W, Sn, Ag, Au, or a combination thereof. The electrode pad 230 may be formed by a pulse plating or a DC plating method. An under bump metal (UBM) may be formed on the electrode pad 230.

The chip connection member 420 may be formed at an upper surface of the electrode 230 and may connect a plurality of semiconductor chip structures. The chip connection member 420 may be formed of a conductive material, such as Cu, Al, Ag, Tin, Au, or solder. When the chip connection member 420 is formed with multiple layers, the chip connection member 420 may include a copper pillar and solder, and when the chip connection member 420 is formed as a single layer, the chip connection member 420 may be formed of Sn—Ag solder or Cu. In an embodiment, the chip connection member 420 may be formed of Sn—Ag solder. Although particular examples of layers and materials have been given the chip connection member may include other layers and other materials.

Figure 2B:
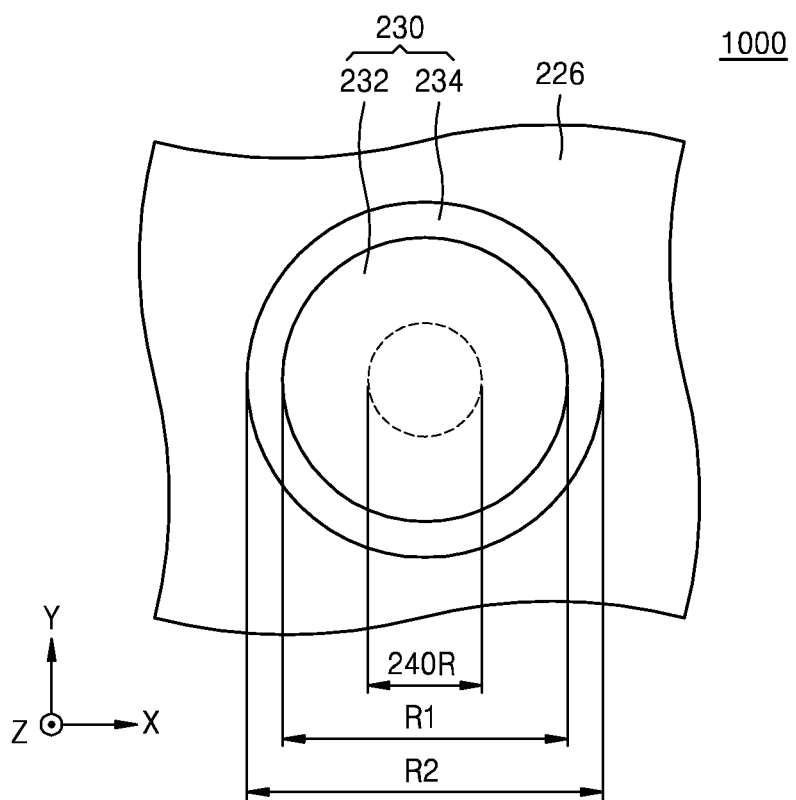
FIG. 2B is a plan view of some elements of a semiconductor package according to an embodiment.

FIG. 2B is a plan view of the upper surface of the third passivation layer 226, and the electrode pad 230, which are included in the electrode pad bonding portion A of the semiconductor package 1000. The chip connection member 420 is not illustrated in FIG. 2B. The semiconductor package 1000 may include multiple electrode pads 230 formed at the upper surface of the third passivation layer 226.

Referring to FIG. 2B, a lower surface of the electrode pad 230 formed at the upper surface of the third passivation layer 226 may be formed as a circular shape. The diameter R1 of the body portion 232 of the electrode pad 230 may be smaller than the diameter R2 of the through-portion 234 of the electrode pad 230. The body portion 232 may be formed as a cylindrical shape or a pillar shape, and the through-portion 234 may be formed as a ring shape or a pipe shape. For example, the through-portion 234 may be formed to surround the side surface portion of the through-electrode 240 as a ring shape. The body portion 232 and the through-portion 234 may be formed such that an edge of their horizontal cross-sections is a concentric circle. The through-portion 234 may be partially overlapped by the body portion 232 as illustrated in FIG. 2B.

The semiconductor package 1000 according to embodiments illustrated in FIGS. 2A and 2B may be formed such that the passivation layer 220 is formed on the non-active surface 210NA of the semiconductor chip 210 as a triple structure including the first through third passivation layers 222 through 226, and the through-portion 234 of the electrode pad 230 penetrates the third passivation layer 226. For example, the passivation layer 220 may be formed as a $SiO_x$—SiN—$SiO_x$ (ONO) structure. That is, the first passivation layer 222 may be formed of a silicon oxide ($SiO_x$) layer, the second passivation layer 224 may be formed of a silicon nitride (SiN) layer, and the third passivation layer 226 may be formed of a silicon oxide ($SiO_x$) layer. According to some embodiments, the through-portion 234 of the electrode pad 230 may be formed such that the through-portion 234 penetrates the third passivation layer 226 so that the lower end of the through-portion 234 contacts the second passivation layer 224. The second passivation layer 224 may be stronger against mechanical stress than the third passivation layer 226. Thus, a fracture defect in the passivation layer 220, such as upper surface cracks of the passivation layer 220, which may occur in a process of forming the electrode pad 230, may be reduced if not prevented. According to some embodiments, a refresh defect, which may occur since a metal atom included in the wiring metal layer 242 of the through-electrode 240 may contaminate the semiconductor package 1000, may also be reduced or prevented by the second region 224b of the second passivation layer 224. Therefore, the semiconductor package 1000 according to some embodiments may reduce or eliminate defects in the elements of the semiconductor package 1000, such as the passivation layer 220, the electrode pad 230, and the through-electrode 240, thereby increasing the reliability of the semiconductor package 1000.

FIGS. 3 through 6A are enlarged cross-sectional views of semiconductor packages 1000-2 through 1000-5 according to various embodiments. The semiconductor packages 1000-2 through 1000-5 are examples in which the electrode pad bonding portion A of the semiconductor package 1000 of FIG. 1 is substituted by electrode pad bonding portions A-2 through A-5, respectively.

Figure 3:
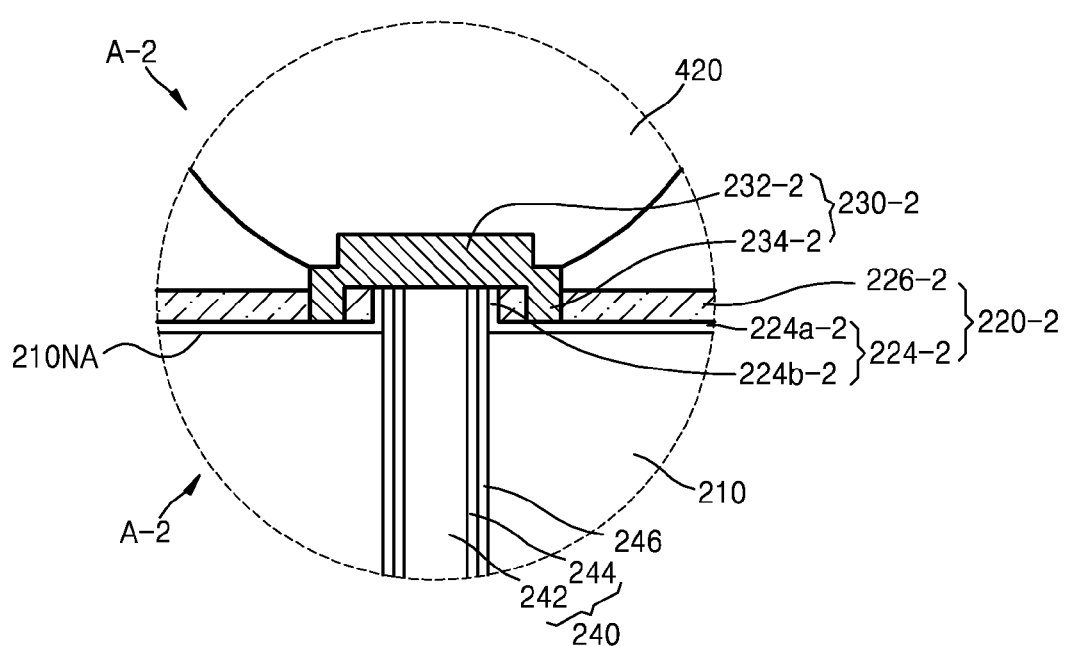
FIGS. 3 through 5 are enlarged cross-sectional views of elements of semiconductor packages according to various embodiments.

Referring to FIG. 3, the semiconductor package 1000-2 including the electrode pad bonding portion A-2 may include the semiconductor chip 210, a passivation layer 220-2, an electrode pad 230-2, the through-electrode 240, and the chip connection member 420. A difference between the electrode pad bonding portion A-2 and the electrode pad bonding portion A illustrated in FIG. 2A is that the passivation layer 220-2 of the electrode pad bonding portion A-2 includes a second passivation layer 224-2 and a third passivation layer 226-2 and does not include the first passivation layer 222 (refer to FIG. 2A). Materials, shapes, and methods of forming of the semiconductor chip 210, the through-electrode 240, and the chip connection member 420 may be similar to the above descriptions of the electrode pad bonding portion A of FIG. 2A, and thus, their descriptions will be omitted. In the electrode pad bonding portion A-2, the second passivation layer 224-2 may be formed of a SiN layer and the third passivation layer 226-2 may be formed of a SiOx layer. In the semiconductor package 1000-2 including the electrode pad bonding portion A-2, a bottommost end of a through-portion 234-2 of the electrode pad 230-2 may be directly connected to an upper surface of the second passivation layer 224-2. Thus, a chance of a fracture defect in the passivation layer 220-2, such as upper surface cracks of the passivation layer 220-2, which may occur in a process of forming the electrode pad 230-2, may be reduced or eliminated.

Figure 4:
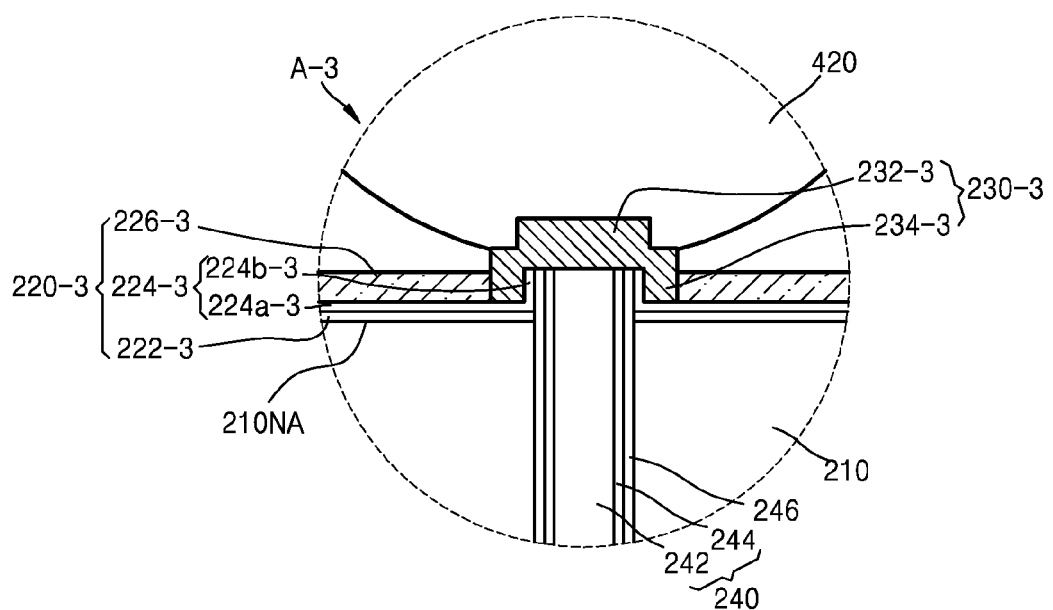

Referring to FIG. 4, the semiconductor package 1000-3 including the electrode pad bonding portion A-3 may include the semiconductor chip 210, a passivation layer 220-3, an electrode pad 230-3, the through-electrode 240, and the chip connection member 420. A difference between the electrode pad bonding portion A-3 and the electrode pad bonding portion A illustrated in FIG. 2A is that a third passivation layer 226-3 is not interposed between a through-portion 234-3 of the electrode pad 230-3 and a second region 224b-3 of a second passivation layer 224-3. Materials, shapes, and methods of forming of the semiconductor chip 210, the through-electrode 240, and the chip connection member 420 are the same as the above descriptions of the electrode pad bonding portion A of FIG. 2A, and thus, their descriptions will be omitted.

Figure 5:
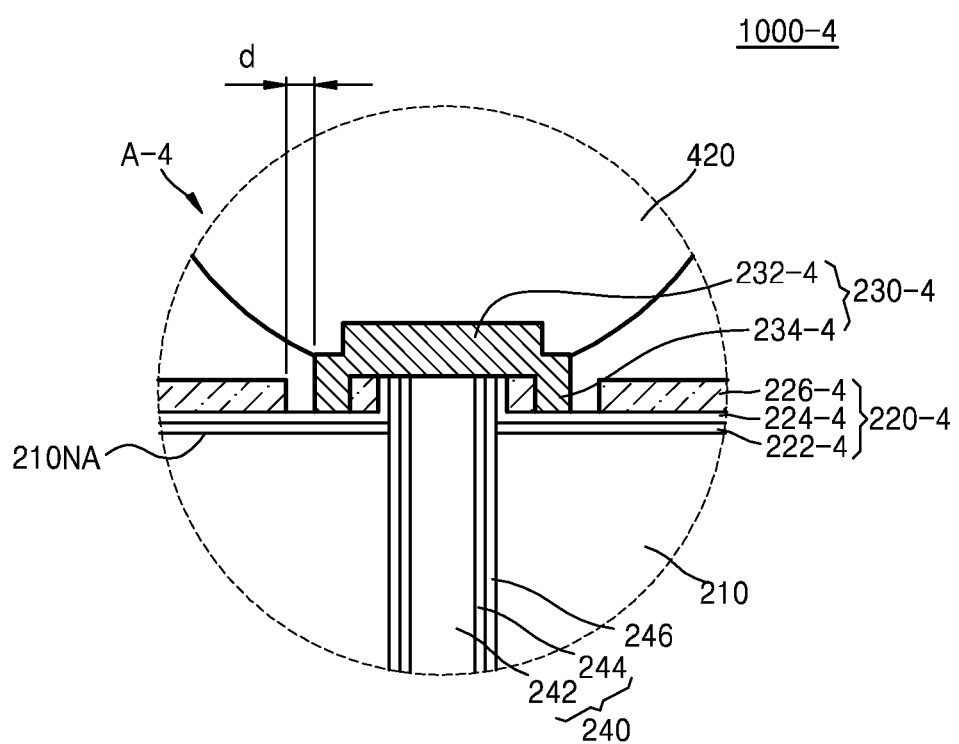

Referring to FIG. 5, the semiconductor package 1000-4 including the electrode pad bonding portion A-4 may include the semiconductor chip 210, a passivation layer 220-4, an electrode pad 230-4, the through-electrode 240, and the chip connection member 420. A difference between the electrode pad bonding portion A-4 and the electrode pad bonding portion A illustrated in FIG. 2A is that an outermost side surface of a through-portion 234-4 of the electrode pad 230-4 is spaced apart from a third passivation layer 226-4. The outermost side surface of the through-portion 234-4 and the third passivation layer 226-4 may be spaced apart from each other by a predetermined distance d. Materials, shapes, and methods of forming of the semiconductor chip 210, the through-electrode 240, and the chip connection member 420 are the same as the above descriptions of the electrode pad bonding portion A of FIG. 2A, and thus, their descriptions will be omitted.

In other embodiments, a semiconductor package may include various combinations of the above electrode pad bonding portion. For example, a semiconductor package may include an electrode pad bonding portion having a separation of a distance d as described with respect to FIG. 5, but without the first passivation layer 222 as illustrated in FIG. 3.

Figure 6A:
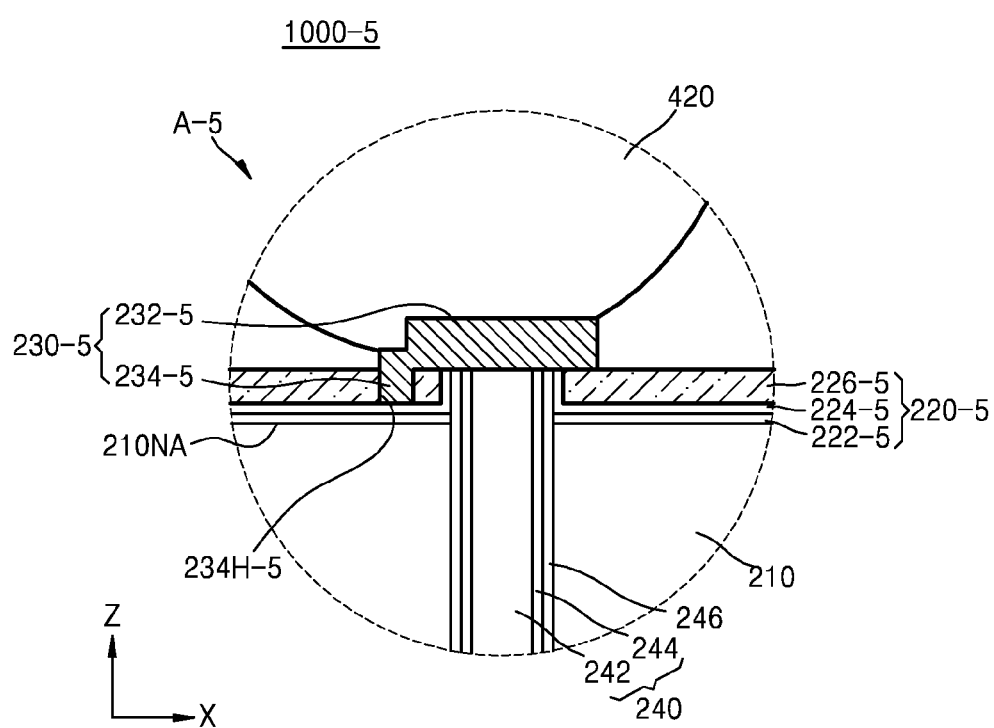
FIG. 6A is an enlarged cross-sectional view of an element of a semiconductor package according to an embodiment.
Figure 6B:
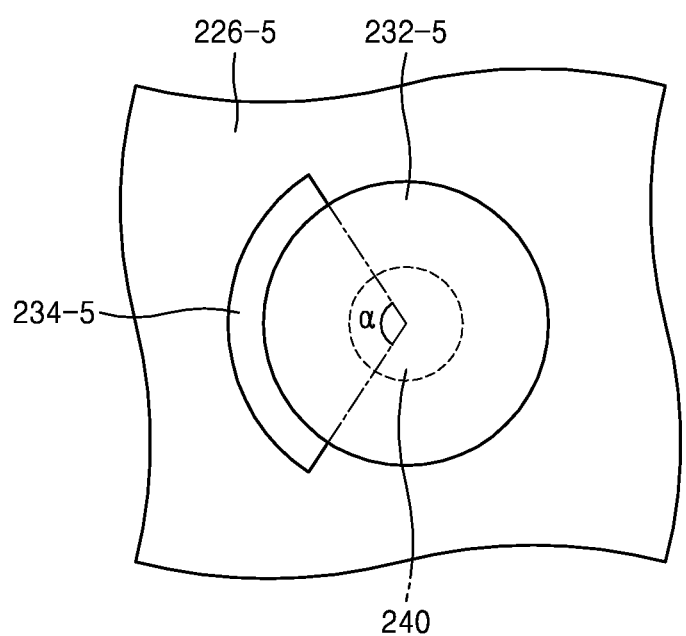
FIG. 6B is a plan view of an element of a semiconductor package according to an embodiment.

FIG. 6A is an enlarged cross-sectional view of the electrode pad bonding portion A-5 of the semiconductor package 1000-5. FIG. 6B is a plan view of an upper surface of the electrode pad bonding portion A-5.

Referring to FIG. 6A, the semiconductor package 1000-5 may include the semiconductor chip 210, a passivation layer 220-5, an electrode pad 230-5, the through-electrode 240, and the chip connection member 420. A difference between the electrode pad bonding portion A-5 and the electrode pad bonding portion A illustrated in FIG. 2A is the shape of the electrode pad 230-5. The electrode pad 230-5 may include a body portion 232-5 and a through-portion 234-5. The body portion 230-5 may contact an upper surface of a third passivation layer 226-5 and extend along the first direction (direction x) which is in parallel with the non-active surface 210NA. The through-portion 234-5 may be formed by penetrating a portion of the third passivation layer 226-5. That is, a through-hole 234H-5 in which the through-portion 234-5 is formed may be formed only at a side of the third passivation layer 226-5 and may not be formed at the other side facing the through-hole 234H-5. For example, the body portion 232-5 may be formed as a cylindrical shape and the through-portion 234-5 may be formed as a fan shape, or an arc shape whose central angle is less than 90°. In other embodiments, the shape of the through-portion 234-5 may have a central angle that is less than 360°. That is, the shape of the through-portion 234-5 may not be continuous around the through-electrode 240. Thus, portions of the third passivation layer 226-5 may be contiguous with portions of the third passivation layer 226-5 under the body portion 232-5. A bottommost surface of the through-portion 234-5 may be directly connected to an upper surface of a second passivation layer 224-5.

FIG. 6B is a plan view of the upper surface of the third passivation layer 226-5, and the electrode pad 230-5, which are included in the electrode pad bonding portion A-5 of the semiconductor package 1000-5. Referring to FIG. 6B, the body portion 232-5 of the electrode pad 230-5 formed at the upper surface of the third passivation layer 226-5 may be formed as a circular shape. A diameter of the body portion 232-5 may be greater than the diameter of the through-electrode 240. The through-portion 234-5 of the electrode pad 230-5 may be formed as a fan shape around a portion of a side surface of the through-electrode 240. According to this embodiment, the through-portion 234-5 may be formed as an arc shape whose central angle α is less than 90°, or less than 360°. The through-portion 234-5 may be formed integrally with the body portion 232-5 and may be partially overlapped by the body portion 232-5.

Although the structures of FIGS. 6A and 6B have been similar to those of FIGS. 2A and 2B, the structures of FIGS. 6A and 6B may have similar variations as illustrated in FIGS. 3-5. For example, the first passivation layer 222-5 may be omitted similar to FIG. 3.

Figure 7:
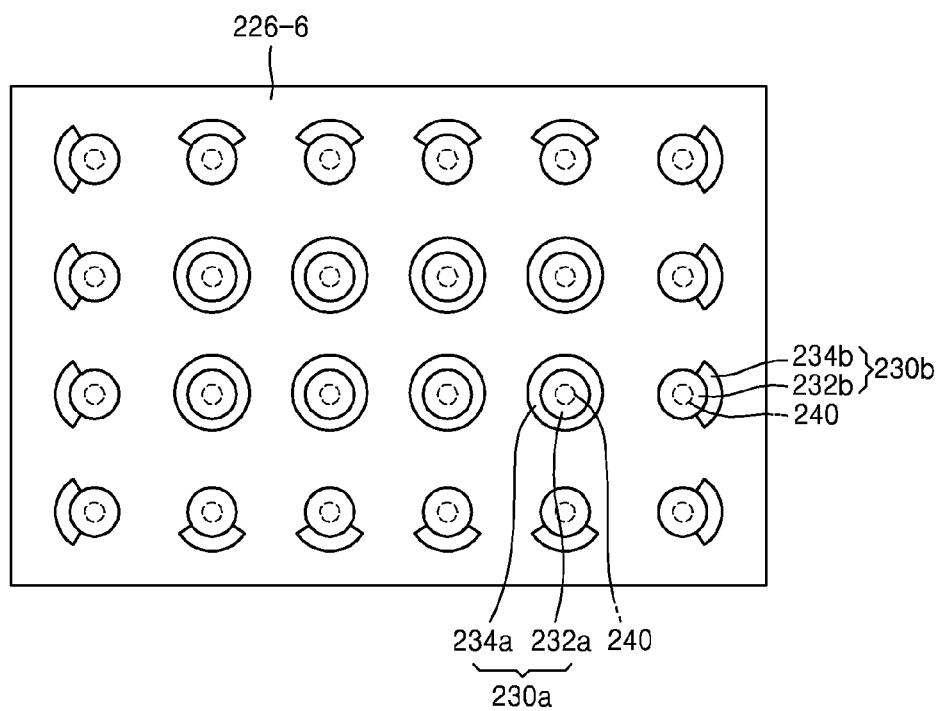
FIG. 7 is a plan view of some elements of a semiconductor package according to an embodiment.

FIG. 7 is a plan view of an upper surface of a third passivation layer 226-6 of a semiconductor package 1000-6 according to embodiments. Referring to FIG. 7, the semiconductor package 1000-6 may include the third passivation layer 226-6 of the passivation layer 220 (refer to FIG. 1) formed at the upper surface of the semiconductor chip 210 (refer to FIG. 1), and a first electrode pad 230a and a second electrode pad 230b formed at the upper surface of the third passivation layer 226-6. The first electrode pad 230a may have a similar shape as the electrode pad 230 illustrated in FIGS. 2A and 2B. The first electrode pad 230a may include a first body portion 232a and a first through-portion 234a. The first body portion 232a may have a similar shape as the body portion 232 illustrated in FIG. 1, and the first through-portion 234a may have a similar shape as the through-portion 234 illustrated in FIG. 1. The second electrode pad 230b may have a similar shape as the electrode pad 230-5 illustrated in FIGS. 6A and 6B. The second electrode pad 230b may include a second body portion 232b and a second through-portion 234b. The second body portion 232b may have a similar shape as the body portion 232-5 illustrated in FIGS. 6A and 6B and the second through-portion 234b may have a similar shape as the through-portion 234-5 illustrated in FIGS. 6A and 6B. That is, the semiconductor package 1000-6 according to some embodiments may have a structure in which a combination of the electrode pads 230 illustrated in FIGS. 2A and 2B and electrode pads 230-5 illustrated in FIGS. 6A and 6B is formed on the third passivation layer 226-6.

The first electrode pad 230a and the second electrode pad 230b may be arranged to form columns or rows on virtual straight lines at the upper surface of the third passivation layer 226-6. It is illustrated in FIG. 7 that six second electrode pads 230b form a row, four second electrode pads 230b form a column, four first electrode pads 230a form a row, and two first electrode pads 230a form a column. However, this arrangement only for convenience of explanation, and the number and the arrangement of the first electrode pads 230a and the second electrode pads 230b are not limited thereto. That is, the number of first electrode pads 230a and second electrode pads 230b, and the locations thereof may be different.

The second electrode pads 230b may be arranged to form a column and a row by being adjacent to each side of the upper surface of the third passivation layer 226-6. That is, the second electrode pads 230b may be arranged adjacent to surround a perimeter of the third passivation layer 226-6. The through-portion 234b of the second electrode pad 230b may be formed toward a corresponding adjacent side of the perimeter of the third passivation layer 226-6. The first electrode pads 230a may be spaced apart from the second electrode pads 230b and disposed at a central or inner portion of the upper surface of the third passivation layer 226-6. The through-portion 234a of the first electrode pad 230a may be formed not to be toward any direction, since the through-portion 234a is formed as a circular shape.

In the semiconductor package 1000-6 according to some embodiments, the second electrode pad 230b including the fan shaped through-portion 234b may be arranged at the outer portion of the upper surface of the third passivation layer 226-6, and the first electrode pad 230a may be arranged at the central or inner portion of the upper surface of the third passivation layer 226-6. During the manufacturing process, the semiconductor package 1000-6 including the through-electrode 240 may have greater stress, due to, for example, external pressures, at an outer portion including each side of the semiconductor chip 210 (refer to FIG. 1), than at the other portions. The semiconductor package 1000-6 is formed such that the second passivation layer 224 (refer to FIG. 2A) is formed of a silicon nitride layer, which is relatively strong against external stress, and a bottommost end of the through-portion 234b of the second electrode pad 230b contacts the upper surface of the second passivation layer 224. Accordingly, a drop of the reliability of the semiconductor package 1000-6, due to stress concentrating on the outer portion of the semiconductor chip 210, may be reduced if not prevented.

FIGS. 8A through 12A are cross-sectional views for describing some of sequential processes of manufacturing the semiconductor package 1000. FIGS. 8B through 12B are enlarged cross-sectional views of some of the sequential processes of manufacturing the semiconductor package 1000 illustrated in FIGS. 8A through 12A.

Figure 8A:
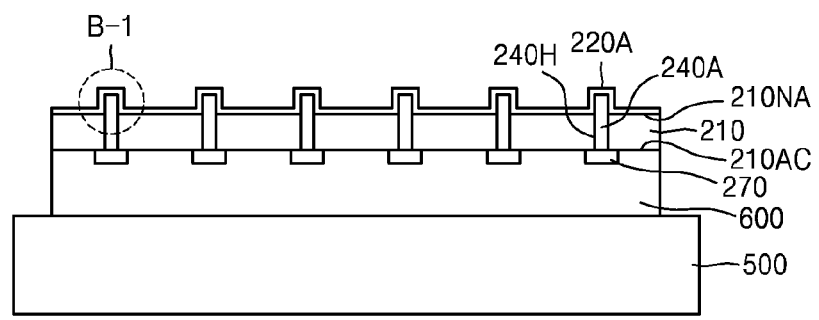
FIGS. 8A, 9A, 10A, 11A, and 12A are cross-sectional views for describing a method of manufacturing a semiconductor package according to various embodiments.
Figure 8B:
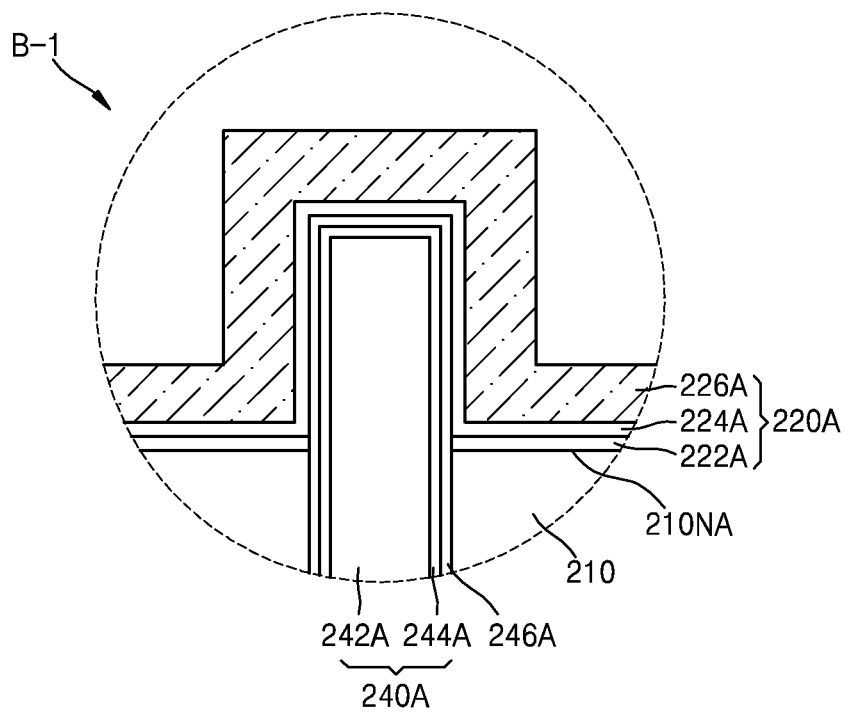
FIGS. 8B, 9B, 10B, 11B, and 12B are enlarged cross-sectional views of some elements in a method of manufacturing a semiconductor package according to various embodiments.

Referring to FIGS. 8A and 8B, to manufacture the semiconductor package 1000, the semiconductor chip 210 including the active surface 210AC, and the non-active surface 210NA facing the active surface 210AC is prepared. After a through-electrode hole 240H is formed in the active surface 210AC, a through-electrode pattern 240A filling the through-electrode hole 240H is formed. A passivation pattern 220A covering the non-active surface 210NA and an upper surface and a protruding side surface of the through-electrode 240 is formed.

The semiconductor chip 210 may include a memory device, a core circuit device, a peripheral circuit device, a logic circuit device, a control circuit device, or the like. In an embodiment, the semiconductor chip 210 may include a semiconductor memory device, such as dynamic random access memory (DRAM), static random access memory (SRAM), flash memory, or other memory devices.

The through-electrode hole 240H penetrating perpendicularly between the non-active surface 210NA and the active surface 210AC of the semiconductor chip 210 may be formed. The through-electrode hole 240H may be formed by using a dry etch process, a wet etch process, a drilling method using a laser, a mechanical drilling method, or the like.

After the through-electrode hole 240H is formed, the through-electrode pattern 240A filling the through-electrode hole 240H may be formed. The through-electrode pattern 240A may protrude such that an upper surface of the through-electrode pattern 240A is higher than an upper surface of the non-active surface 210NA. In detail, a through-electrode insulating layer pattern 246A is formed on the non-active surface 210NA. The through-electrode insulating layer pattern 246A may be formed of a silicon oxide (SiO$_x$) layer, a silicon oxynitride (SiO$_n$) layer, a silicon nitride (SiN) layer, or a combination thereof. In some embodiments, the through-electrode insulating layer pattern 246A may be formed of a polymer layer. The through-electrode insulating layer pattern 246A may be formed by using a chemical vapor deposition (CVD), an atomic layer deposition (ALD), a physical vapor deposition (PVD) method, or other processes. After the through-electrode insulating layer pattern 246A is formed, a barrier metal layer pattern 244A and a metal wiring layer pattern 242A may be sequentially formed in the through-electrode hole 240H in which the through-electrode insulating layer pattern 246A is formed. The barrier metal layer pattern 244A may be formed conformally on the through-electrode insulating layer pattern 246A. The barrier metal layer pattern 244A may be formed of at least one selected from Ti, Ta, TiN, and TaN, or a double layer or a mixed layer other than a double layer. The barrier metal layer pattern 244A may be formed by using the CVD, ALD, or PVD methods, or other similar methods. The metal wiring layer pattern 242A may fill the through-electrode hole 240H in which the bather metal layer pattern 244A is formed. The wiring metal layer pattern 242A may be formed of Al, Au, Be, Bi, Co, Cu, Hf, In, Mn, Mo, Ni, Pb, Pd, Pt, Rh, Re, Ru, Ta, Te, Ti, W, Zn, Zr, or a combination thereof. The wiring metal layer pattern 242A may be formed by a plating method, a deposition method, or other method.

After the through-electrode pattern 240A is formed, the lower electrode 270 may be formed on the active surface 210AC. The lower electrode 270 may be electrically and/or physically connected with the through-electrode pattern 240A.

After the lower electrode 270 is formed, the lower electrode 270 and the active surface 210AC may be overturned so as to face downwards and may be laid on a carrier wafer 500. The lower electrode 270 and the active surface 210AC may be bonded and fixed to the carrier wafer 500 by using a bonding member 600. The carrier wafer 500 may include an insulating material and may include a material having cushion and elasticity so that the lower electrode 270 is not damaged.

The passivation pattern 220A covering exposed upper and side surfaces of the through-electrode insulating layer pattern 246A, and the non-active surface 210NA, may be formed. The passivation pattern 220A may include a first passivation pattern 222A, a second passivation pattern 224A, and a third passivation pattern 226A. The first passivation pattern 222A may be formed to conformally cover an upper surface of the non-active surface 210NA. The second passivation pattern 224A may be formed to conformally cover the first passivation pattern 222A and the through-electrode insulating layer pattern 246A. The third passivation pattern 226A may be formed to conformally cover the second passivation pattern 224A. The first through third passivation patterns 222A through 226A each may be formed by using a CVD, ALD, or PVD method. The third passivation pattern 226A may be formed thicker than the first passivation pattern 222A and the second passivation pattern 224A. For example, the first passivation pattern 222A and the third passivation pattern 226A may be formed of a silicon oxide (SiO$_x$) layer and the second passivation pattern 224A may be formed of a silicon nitride (SiN) layer.

Figure 9A:
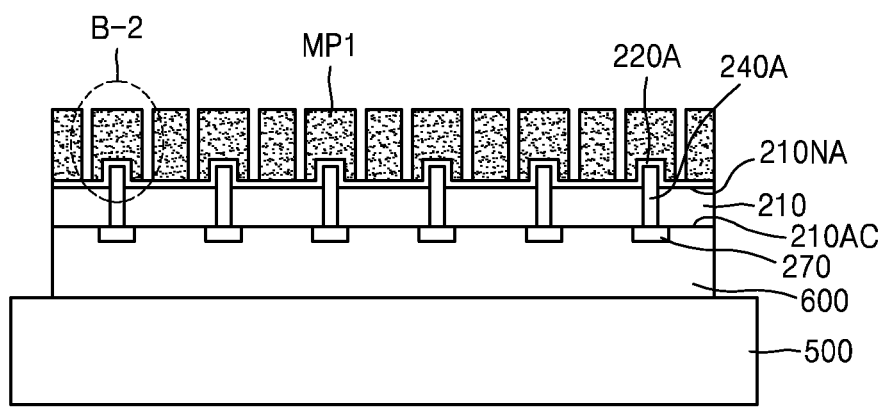
Figure 9B:
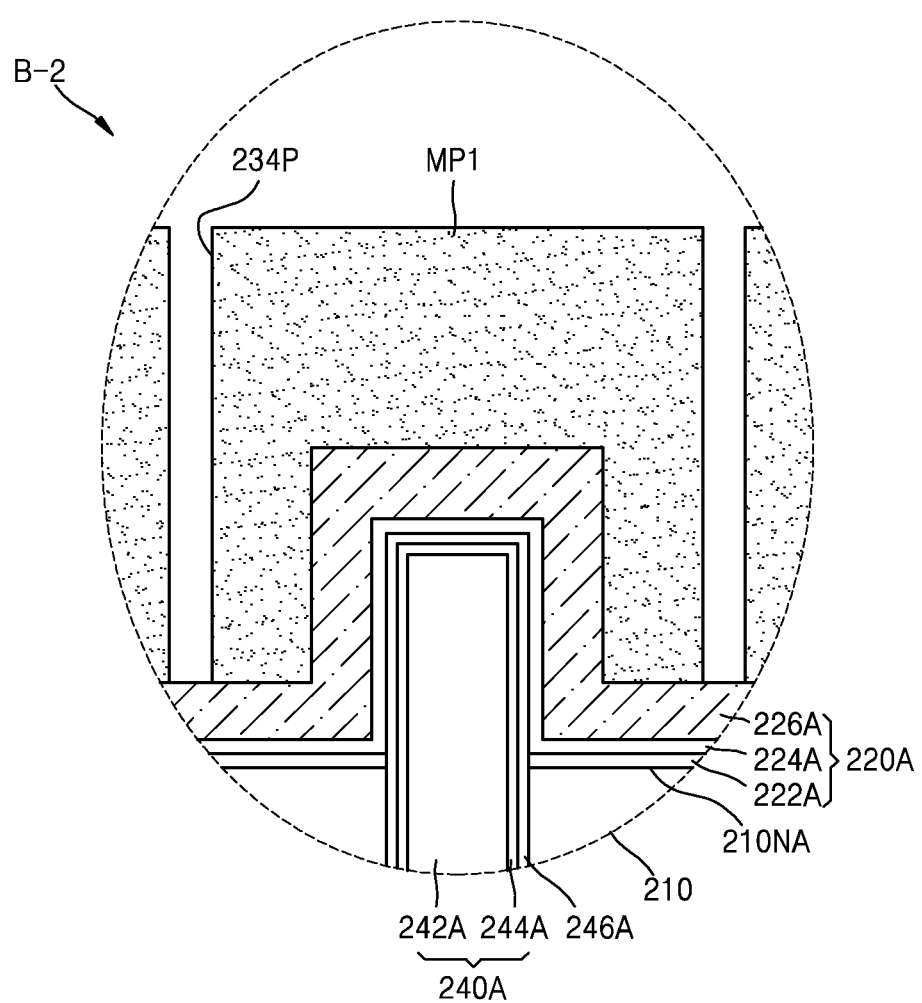

Referring to FIGS. 9A and 9B, a first mask pattern MP1 may be formed on the third passivation pattern 226A. The first mask pattern MP1 may include a photoresist or other similar mask material. An opening portion for an electrode pad pattern 234P is formed in the first mask pattern MP1 by a light exposure and development method. That is, a mask pattern corresponding to the opening portion for an electrode pad pattern 234P may be removed.

Figure 10A:
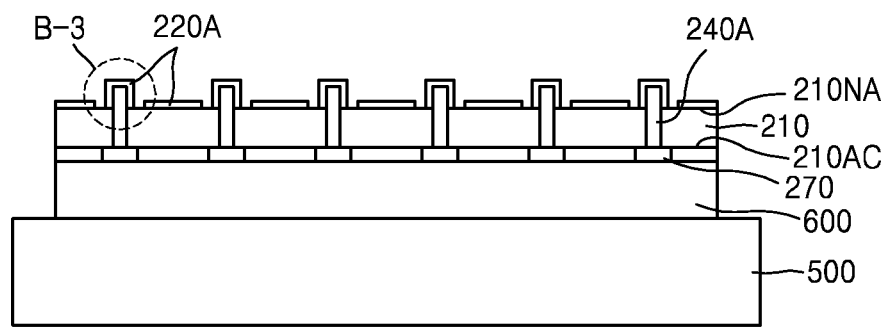
Figure 10B:
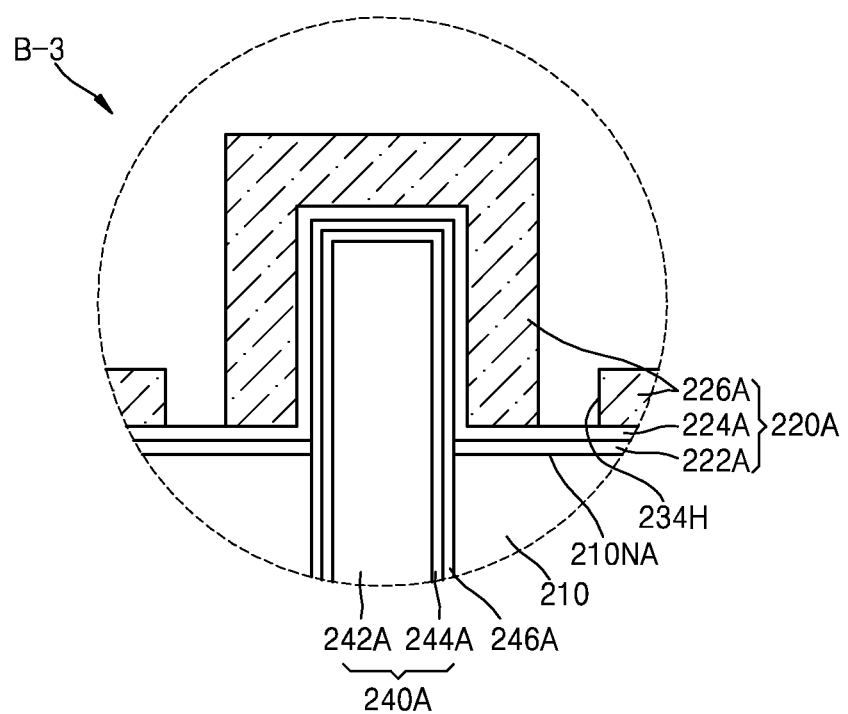

Referring to FIGS. 10A and 10B, the third passivation pattern 226 may be etched by using the first mask pattern MP1 as an etch mask. Then, the first mask pattern MP1 may be removed. In detail, the third passivation pattern 226A which is not covered by the first mask pattern MP1 and exposed, that is, the third passivation pattern 226A formed in the electrode pad pattern 234P (refer to FIG. 9B) may be selectively removed or recessed to form the electrode pad hole 234H. A portion of an upper surface of the second passivation pattern 224A may be exposed by the above process. The electrode pad hole 234H may be formed by etching the third passivation pattern 226A by using a dry etching or wet etching method. For example, the third passivation pattern 226A may be formed of a silicon oxide (SiO$_x$) layer and the second passivation pattern 224A may be formed of a silicon nitride (SiN) layer. Thus, the above described etching may be performed by using a solution or gas selectively etching only the silicon oxide ($SiO_x$) layer.

After the electrode pad hole 234H is formed, the first mask pattern MP1 may be removed. The removing of the first mask pattern MP1 may include a process of removing a photoresist, such as sulfuric acid boil, oxygen plasma, and ashing.

Figure 11A:
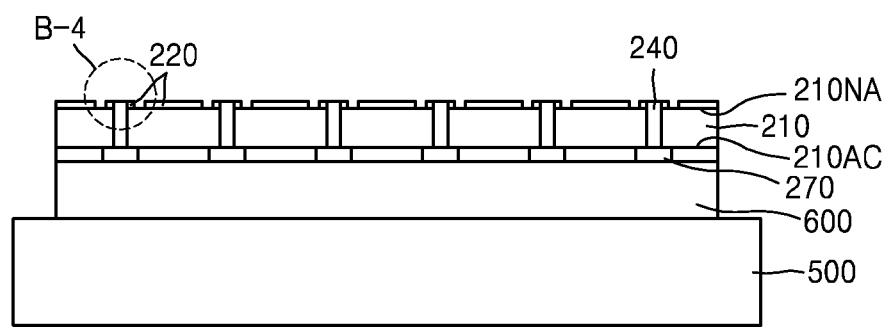
Figure 11B:
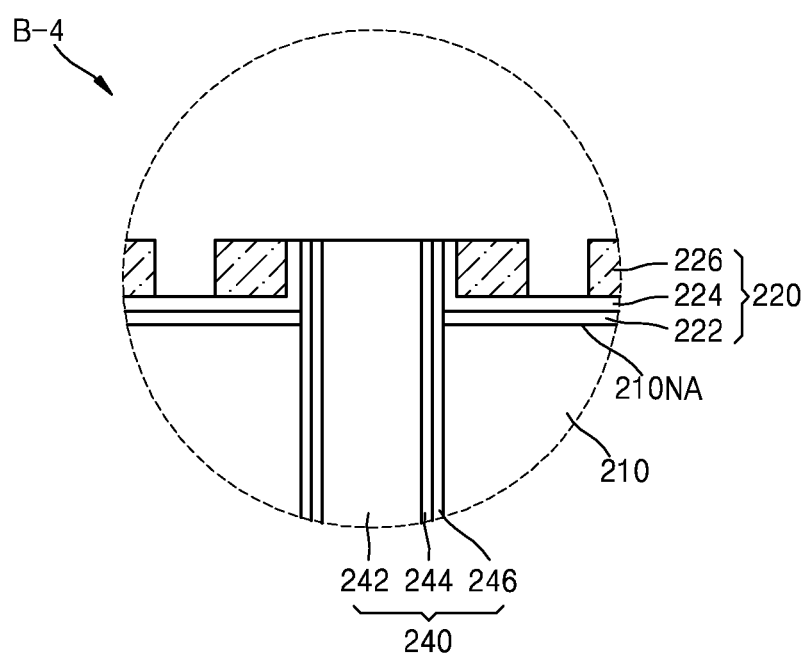

Referring to FIGS. 11A and 11B, a portion of the exposed passivation pattern 220A and a portion of the through-electrode pattern 240A may be removed and planarized to form the passivation layer 220 and the through-electrode 240. In detail, exposed portions of the third passivation pattern 226A, the second passivation pattern 224A, the through-electrode insulating layer pattern 246A, the barrier metal layer pattern 244A, and the wiring metal layer pattern 242A on the non-active surface 210NA may be planarized. The planarization process may be performed by a chemical mechanical polishing (CMP) and/or an etch back method. For example, the planarization process may be performed by the CMP method. Through the planarization process, the passivation layer 220 and the through-electrode 240 may be formed. An uppermost surface of the passivation layer 220 and an uppermost surface of the through-electrode 240 may be formed as the same level.

Figure 12A:
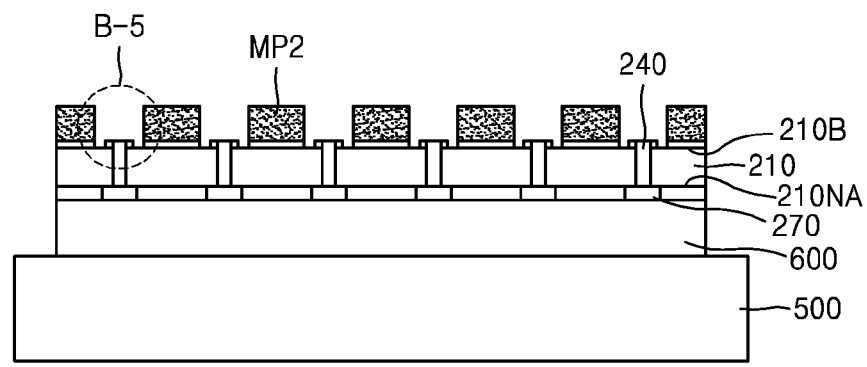
Figure 12B:
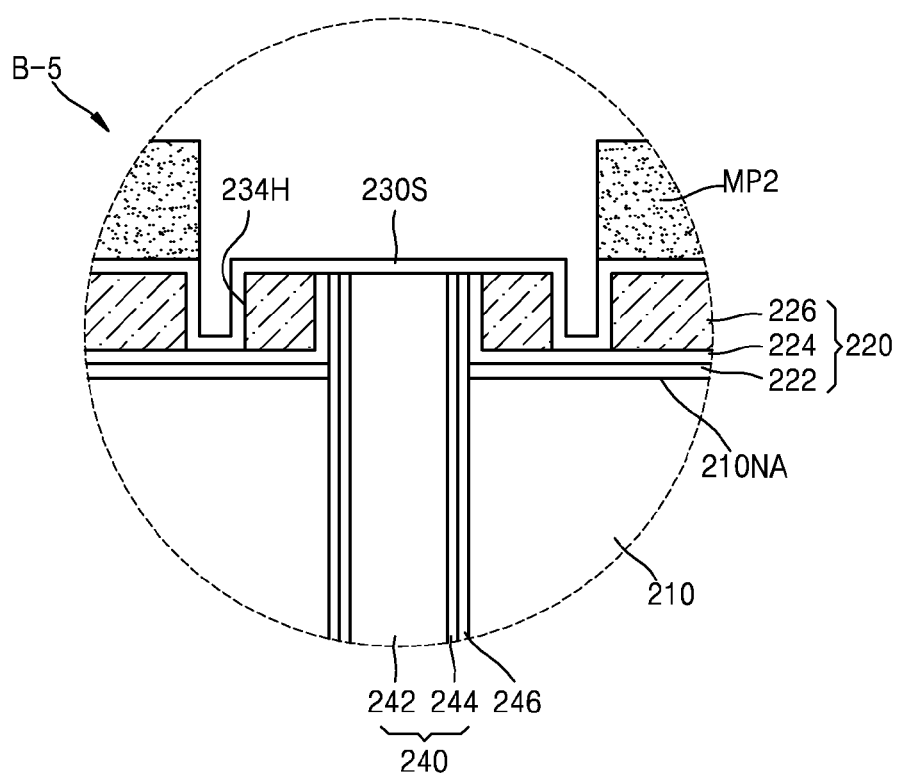

Referring to FIGS. 12A and 12B, an electrode pad seed layer 230S may be spread on the third passivation layer 226 and a second mask pattern MP2 may be formed on the electrode pad seed layer 230S. In detail, the electrode pad seed layer 230S may be conformally spread on the third passivation layer 226. The electrode pad seed layer 230S may be formed of a layer including any one alloy selected from Ti/Cu, Ti/Pd, Ti/Ni, Cr/Cu, and a combination thereof. The electrode pad seed layer 230S may be formed by a sputtering method.

The second mask pattern MP2 is formed on the electrode pad seed layer 230S. The second mask pattern MP2 may include a photoresist. The second mask pattern MP2 may be formed on the third passivation layer 226 to cover the electrode pad seed layer 230S. However, the second mask pattern MP2 may be formed not to cover the through-electrode 240 and the third passivation layer 226 surrounding the through-electrode 240.

After the process illustrated in FIGS. 12A and 12B, the electrode pad 230 (refer to FIG. 2A) may be formed by forming an electrode pad metal layer on the electrode pad seed layer 230S formed between the electrode pad hole 234H and the exposed electrode pad hole 234H. After the electrode pad 230 is formed, the second mask pattern MP2 may be removed and the electrode pad seed layer 230S remaining on the third passivation layer 226 may be removed.

The electrode pad 230 may be formed by plating the electrode pad metal layer by using a pulse plating method or a DC plating method. The electrode pad 230 may be formed of at least one metal material selected from Al, Cu, Ni, W, Sn, Ag, and Au. In an embodiment, the electrode pad 230 may be formed by using an electroplating method, and thus, may include the body portion 232 (refer to FIG. 2A) and the through-portion 234 (refer to FIG. 2A). The electrode pad 230 may be formed to have uniform thickness on the electrode pad seed layer 230S. Accordingly, a diameter of an edge of the body portion 232 may be smaller than a diameter of an edge of the through-portion 234. (refer to FIG. 2B).

After the electrode pad 230 is formed, the second mask pattern MP2 may be removed. The removing of the second mask pattern MP2 may be performed by using sulfuric acid boil, an oxygen plasma method, or an ashing method. The remaining electrode pad seed layer 230S may be removed by a chemical etching method. The removing of the remaining electrode pad seed layer 230S may be performed by using a wet etching method using SC-1 including, for example, $H_2O_2$ and/or $NH_4OH$.

The semiconductor package 1000 according to the present embodiments may be manufactured by stacking on the substrate 100 (refer to FIG. 1) a plurality of semiconductor chips 210 including the electrode pad 230 and the through-electrode 240.

Although a particular technique of forming a semiconductor chip 210 has been described above, the technique may be varied to form other structures. For example, the first passivation pattern 222A may be omitted to form structures similar to FIG. 3. Various mask patterns, openings in mask patterns, sequences of processes, or the like may be used to form the various structures described above.

Figure 13:
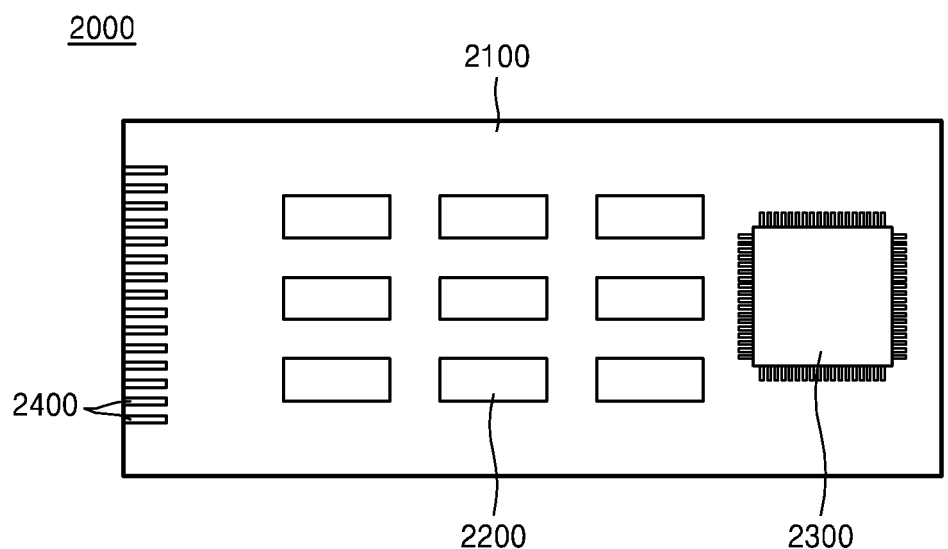
FIG. 13 is a plan view of a package module including semiconductor packages according to some embodiments.

FIG. 13 is a plan view of a package module 2000 including the semiconductor packages 1000 through 1000-5. Referring to FIG. 13, the package module 2000 include a semiconductor integrated circuit chip 2200 or a quad flat package (QFP) semiconductor integrated circuit chip 2300. The package module 2000 may be formed by installing the semiconductor integrated circuit chip 2200 or the QFP semiconductor integrated circuit chip 2300 on the substrate 2100. One or more of the semiconductor integrated circuit chip 2200 or the QFP semiconductor integrated circuit chip 2300 may include semiconductor chip package technologies according to the various embodiments described herein. The package module 2000 may be connected with an external electronic device through an external connection terminal 2400 provided at a side of the substrate 2100.

Figure 14:
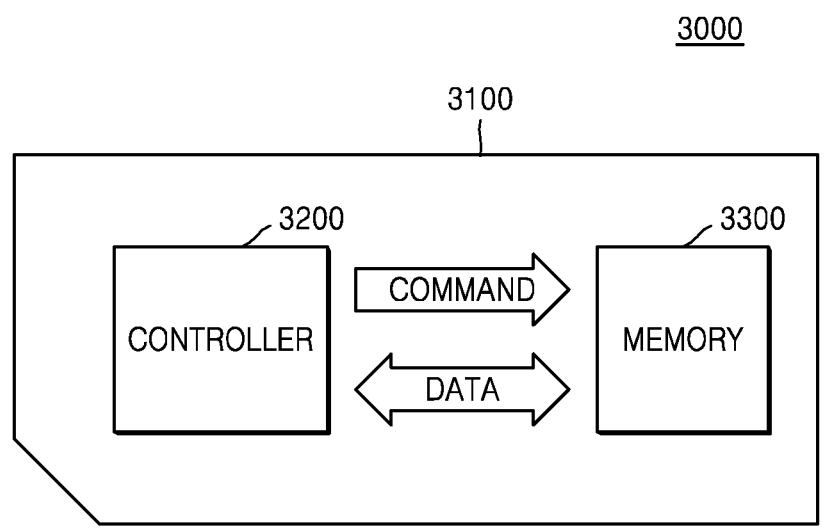
FIG. 14 is a block diagram of a memory card including semiconductor packages according to some embodiments.

FIG. 14 is a block diagram of a memory card 3000 including one or more of semiconductor packages according to some embodiments. Referring to FIG. 14, the memory card 3000 may include a controller 3200 and a memory 3300 in a housing 3100. The controller 3200 and the memory 3300 may exchange electrical signals. For example, in response to a command of the controller 3200, the memory 3300 and the controller 3200 may exchange data. Accordingly, the memory card 3000 may store data in the memory 3300 or output the data from the memory 3300 to the outside.

The controller 3200 and/or the memory 3300 may include the semiconductor packages described herein such as semiconductor packages 1000 through 1000-5. The memory card 3000 may be used as a data storage medium in various portable devices. For example, the memory card 3000 may include a multimedia card (MMC) or a secure digital (SD) card.

Figure 15:
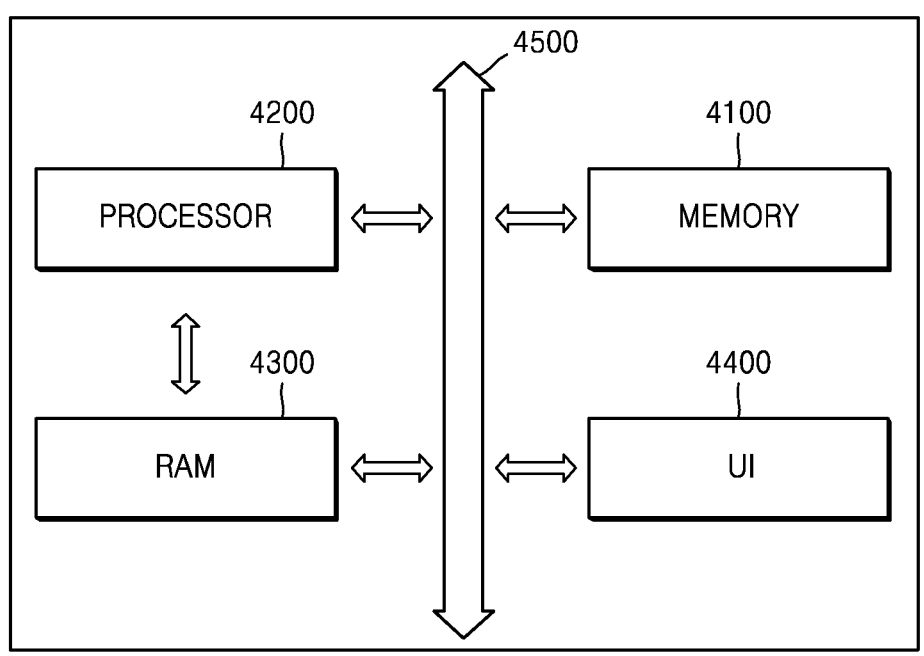
FIG. 15 is a block diagram of an electronic system including semiconductor packages according to some embodiments.

FIG. 15 is a block diagram of an electronic system 4000 including the semiconductor packages 1000 through 1000-5. Referring to FIG. 15, the electronic system 4000 may include at least one of the semiconductor packages described herein such as semiconductor packages 1000 through 1000-5. The electronic system 4000 may include a mobile device or a computer. For example, the electronic system 4000 may include a memory system 4100, a processor 4200, RAM 4300, and a user interface 4400. The memory system 4100, the processor 4200, the RAM 4300, and the user interface 4400 may communicate with one another via a bus 4500. The processor 4200 may execute a program and control the electronic system 4000. The RAM 4300 may be used as an operating memory of the processor 4200.

For example, the processor 4200 and the RAM 4300 each may include semiconductor packages similar to the semiconductor packages 1000 through 1000-5. Alternatively, the processor 4200 and the RAM 4300 may be included in one package. The user interface 4400 may be used in inputting or outputting data in/from the electronic system 4000. The memory system 4100 may store a code for operation of the processor 4200, data processed by the processor 4200, or data input from the outside. The memory system 4100 may include a controller and a memory, and may be substantially similar to the memory card 3000 of FIG. 14.

The electronic system 4000 may be realized as a mobile system, a personal computer, an industrial computer, or a logic system performing various functions. For example, the mobile system may be any one of a personal digital assistant (PDA), a portable computer, a web tablet, a mobile phone, a wireless phone, a laptop computer, a memory card, a digital music system, and an information transmission/reception system. When the electronic system 4000 is a device which may perform wireless communication, the electronic system 4000 may be used in a communication interface protocol, such as third generation communication system, such as CDMA, GSM, NADC, E-TDMA, WCDMA, CDMA2000, or other similar systems.

Figure 16:
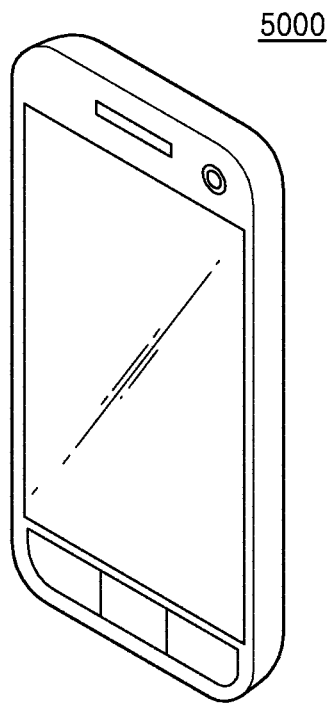
FIG. 16 is a view of a mobile phone adopting an electronic system including semiconductor packages according to some embodiments.

FIG. 16 is a view of a mobile phone 5000 including an electronic system including semiconductor packages as described herein such as the semiconductor packages 1000 through 1000-5.

In addition, the electronic system 4000 (refer to FIG. 15) may be applied in a portable laptop computer, an MP3 player, navigation, solid state disk (SSD), an automobile, household appliances, or other electronic systems.

An embodiment includes a semiconductor package which may prevent defects due to external stress in a structure in which a plurality of semiconductor chips having through-electrodes are stacked.

An embodiment includes a semiconductor package including: a semiconductor chip including a first surface and a second surface facing the first surface; a through-electrode penetrating between the first surface and the second surface; a passivation layer formed on the second surface of the semiconductor chip; and an electrode pad formed on an upper surface of the passivation layer and electrically connected to the through-electrode, wherein the passivation layer includes a first passivation layer formed on the second surface of the semiconductor chip and a second passivation layer formed on an upper surface of the first passivation layer, and the electrode pad is directly connected to an upper surface of the through-electrode and penetrates the second passivation layer to contact the upper surface of the first passivation layer.

The electrode pad may include a body portion and a through-portion, and the through-portion may be formed such that the through-portion surrounds a side surface of the through-electrode.

The first passivation layer may include: a semiconductor chip passivation layer extending along the second surface of the semiconductor chip; and a through-electrode passivation layer contacting the side surface of the through-electrode and extending between the through-portion and the through-electrode along a direction perpendicular to the second surface of the semiconductor chip.

The second passivation layer may be interposed between the through-electrode passivation layer and the through-portion.

The first passivation layer may be formed of a silicon nitride layer.

The semiconductor package may further include a third passivation layer formed between the second surface of the semiconductor chip and the first passivation layer.

The body portion may be formed as a cylindrical shape, and a diameter of an uppermost end of the body portion may be smaller than a diameter of a bottommost end of the body portion.

The semiconductor chip may be provided in a multiple number. The semiconductor package may further include a chip connection member. The plurality of the semiconductor chips may be connected to one another via the chip connection member.

The semiconductor package may further include a substrate on which the semiconductor chip is mounted; and a molding member covering an upper surface of the substrate and upper and side surfaces of the semiconductor chip.

An embodiment includes a semiconductor package including: at least one semiconductor chip stacked on a substrate; a through-electrode penetrating the at least one semiconductor chip; a first passivation layer formed on an upper surface of the at least one semiconductor chip; a second passivation layer formed on an upper surface of the first passivation layer; and a first electrode pad contacting an upper surface of the second passivation layer and extending in parallel with the upper surface of the second passivation layer, wherein a portion of the first electrode pad penetrates the second passivation layer to contact the upper surface of the first passivation layer and surround a portion of a side surface of the through-electrode.

The through-electrode may be formed as a cylindrical shape, and the first electrode pad may penetrate a portion of the second passivation layer to surround the portion of the side surface of the through-electrode in a fan shape.

The semiconductor package may further include a third passivation layer formed between the upper surface of the at least one semiconductor chip and the first passivation layer.

The first electrode pad may be provided in a multiple number, and the first electrode pad may be adjacent to each side of an upper surface of the third passivation layer so as to be arranged in an outer portion of the upper surface of the third passivation layer.

The semiconductor package may further include a second electrode pad contacting the upper surface of the second passivation layer and formed in parallel with the upper surface of the second passivation layer, wherein the second electrode pad penetrates through the second passivation layer to extend to contact the upper surface of the first passivation layer and to surround the side surface of the through-electrode as a ring shape.

The second electrode pad may be formed at a center portion of the upper surface of the at least one semiconductor chip, apart from the first electrode pad While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
   a semiconductor chip comprising a first surface on a first side of the semiconductor chip and a second surface on a second side of the semiconductor chip, wherein the first side and the second side are opposite sides of the semiconductor chip;
   a through-electrode penetrating the semiconductor chip between the first surface and the second surface;

a passivation layer formed on the second surface of the semiconductor chip; and an electrode pad formed on an upper surface of the passivation layer and electrically connected to the through-electrode, wherein the passivation layer comprises a first passivation layer formed on the second surface of the semiconductor chip and a second passivation layer formed on an upper surface of the first passivation layer, and the electrode pad penetrates the second passivation layer to contact the upper surface of the first passivation layer.

2. The semiconductor package of claim 1, wherein:
the electrode pad comprises a body portion and a through-portion, and
the through-portion is formed such that the through-portion faces a side surface of the through-electrode.

3. The semiconductor package of claim 2, wherein the through-portion surrounds the side surface of the through-electrode.

4. The semiconductor package of claim 2, wherein the through-portion extends only partially around the side surface of the through-electrode.

5. The semiconductor package of claim 2, wherein the first passivation layer comprises:
a semiconductor chip passivation layer extending along the second surface of the semiconductor chip; and
a through-electrode passivation layer contacting the side surface of the through-electrode and extending between the through-portion and the through-electrode along a direction perpendicular to the second surface of the semiconductor chip.

6. The semiconductor package of claim 5, wherein the through-portion contacts the through-electrode passivation layer contacting the side surface of the through-electrode.

7. The semiconductor package of claim 5, wherein the second passivation layer is interposed between the through-electrode passivation layer and the through-portion.

8. The semiconductor package of claim 2, wherein the through-portion is separated from the second passivation layer.

9. The semiconductor package of claim 2, wherein the body portion is formed as a cylindrical shape, and a diameter of an uppermost end of the body portion is smaller than a diameter of a bottommost end of the through-portion.

10. The semiconductor package of claim 1, wherein the first passivation layer is formed of a silicon nitride layer.

11. The semiconductor package of claim 1, further comprising a third passivation layer formed between the second surface of the semiconductor chip and the first passivation layer.

12. A semiconductor package comprising:
a plurality of semiconductor chips stacked on a substrate, including a first semiconductor chip comprising:
a through-electrode penetrating the first semiconductor chip;
a first passivation layer formed on an upper surface of the first semiconductor chip;
a second passivation layer formed on an upper surface of the first passivation layer; and
a first electrode pad contacting an upper surface of the second passivation layer, extending in parallel with the upper surface of the second passivation layer, and including a portion penetrating the second passivation layer to contact the upper surface of the first passivation layer; and a second semiconductor chip of the plurality of the semiconductor chips electrically coupled to the first electrode pad of the first semiconductor chip.

13. The semiconductor package of claim 12, further comprising:
a plurality of chip connection members;
wherein the semiconductor chips are electrically connected to one another via the chip connection members.

14. The semiconductor package of claim 12, further comprising a molding member covering an upper surface of the substrate and upper and side surfaces of the semiconductor chips.

15. The semiconductor package of claim 12, wherein the through-electrode of the first semiconductor chip is formed as a cylindrical shape, and
the first electrode pad penetrates a portion of the second passivation layer to extend around a portion of a side surface of the through-electrode in a fan shape.

16. The semiconductor package of claim 15, wherein
the first semiconductor chip further comprises a second electrode pad; and
the first electrode pad is disposed adjacent to a perimeter of the first semiconductor chip;
the second electrode pad is disposed on a side of the first electrode closer to a center of the first electrode pad; and
the second electrode pad includes a portion penetrating the second passivation layer to contact the upper surface of the first passivation layer, the portion surrounding the side surface of the through-electrode.

17. The semiconductor package of claim 12, further comprising a third passivation layer of the first semiconductor chip formed between the upper surface of the first semiconductor chip and the first passivation layer of the first semiconductor chip.

18. A semiconductor package, comprising:
a semiconductor chip;
a through-electrode penetrating the semiconductor chip;
a first passivation layer formed on an upper surface of the semiconductor chip;
a second passivation layer formed on an upper surface of the first passivation layer; and
an electrode pad electrically connected to the through-electrode, penetrating the second passivation layer, and contacting the first passivation layer;
wherein the electrode pad extends across an uppermost surface of the through-electrode.

19. The semiconductor package of claim 18, wherein the electrode pad comprises:
a first portion disposed on the second passivation layer; and
a second portion penetrating the second passivation layer;
wherein:
a lowest surface of the second portion is lower than an uppermost surface of the through-electrode; and
the lowest surface of the first portion contacts the through-electrode.

20. The semiconductor package of claim 18, wherein the electrode pad comprises:
a first portion disposed on the second passivation layer; and
a second portion penetrating the second passivation layer;
wherein a portion of the second passivation layer contacting the first portion is not contiguous with a remainder of the second passivation layer.

* * * * *